(12) United States Patent
Chavan et al.

(10) Patent No.: US 10,707,220 B2
(45) Date of Patent: Jul. 7, 2020

(54) FERROELECTRIC MEMORY AND METHODS OF FORMING THE SAME

(71) Applicant: Micron Technology, Inc., Boise, ID (US)

(72) Inventors: Ashonita A. Chavan, Boise, ID (US); Alessandro Calderoni, Boise, ID (US); D. V. Nirmal Ramaswamy, Boise, ID (US)

(73) Assignee: Micron Technology, Inc., Boise, ID (US)

(*) Notice: Subject to any disclaimer, the term of this patent is extended or adjusted under 35 U.S.C. 154(b) by 99 days.

(21) Appl. No.: 15/691,806

(22) Filed: Aug. 31, 2017

(65) Prior Publication Data

US 2018/0006044 A1    Jan. 4, 2018

Related U.S. Application Data

(63) Continuation of application No. 14/263,610, filed on Apr. 28, 2014, now Pat. No. 9,768,181.

(51) Int. Cl.
*H01L 27/11507* (2017.01)
*H01L 27/108* (2006.01)
*H01L 29/423* (2006.01)
*H01L 49/02* (2006.01)

(52) U.S. Cl.
CPC .. *H01L 27/11507* (2013.01); *H01L 27/10876* (2013.01); *H01L 28/90* (2013.01); *H01L 29/4236* (2013.01)

(58) Field of Classification Search
CPC ......... H01L 27/108–10897; H01L 2924/1436; H01L 27/11585; H01L 28/40–92; H01L 27/11502–11514; G11C 11/221
See application file for complete search history.

(56) References Cited

U.S. PATENT DOCUMENTS

| 5,812,444 | A | * | 9/1998 | Ema | H01L 27/10808 257/E27.085 |
|---|---|---|---|---|---|
| 5,903,492 | A | | 5/1999 | Takashima | |
| 6,281,535 | B1 | | 8/2001 | Ma et al. | |
| 6,586,793 | B2 | | 7/2003 | Imai et al. | |
| 7,193,260 | B2 | | 3/2007 | Kamoshida et al. | |
| 8,629,494 | B2 | | 1/2014 | Kim et al. | |
| 9,318,693 | B2 | | 4/2016 | Cronin et al. | |
| 10,153,290 | B2 | | 12/2018 | Tsui et al. | |

(Continued)

FOREIGN PATENT DOCUMENTS

| CN | 102891148 A | 1/2013 |
|---|---|---|
| CN | 102956463 A | 3/2013 |

(Continued)

OTHER PUBLICATIONS

Supplementary Search Report from related European patent application No. 15785385.4, dated Mar. 28, 2018, 10 pp.

(Continued)

*Primary Examiner* — Nelson Garces
(74) *Attorney, Agent, or Firm* — Brooks, Cameron & Huebsch, PLLC (57) ABSTRACT

Ferroelectric memory and methods of forming the same are provided. An example memory cell can include a buried recessed access device (BRAD) formed in a substrate and a ferroelectric capacitor formed on the BRAD.

12 Claims, 7 Drawing Sheets

(56) References Cited

U.S. PATENT DOCUMENTS

| | | |
|---|---|---|
| 2001/0000624 A1 | 5/2001 | Hwang et al. |
| 2002/0027798 A1 | 3/2002 | Takashima |
| 2002/0081790 A1 | 6/2002 | Honigschmid et al. |
| 2003/0058701 A1 | 3/2003 | Takashima |
| 2003/0222279 A1 | 12/2003 | Jacob et al. |
| 2004/0090812 A1 | 5/2004 | Takashima |
| 2005/0063225 A1 | 3/2005 | Takashima |
| 2005/0121709 A1* | 6/2005 | Ozaki ............... H01L 27/10876 257/295 |
| 2008/0079046 A1 | 4/2008 | Ozaki |
| 2008/0087927 A1 | 4/2008 | Shin et al. |
| 2009/0267123 A1* | 10/2009 | Yamazaki ......... H01L 27/11504 257/295 |
| 2010/0032743 A1* | 2/2010 | Huang ............... H01L 27/10823 257/306 |
| 2010/0210082 A1 | 8/2010 | Nakamura |
| 2011/0033955 A1 | 2/2011 | Kang |
| 2011/0183507 A1 | 7/2011 | Figura et al. |
| 2012/0313218 A1 | 12/2012 | Fujimori et al. |
| 2013/0052753 A1 | 2/2013 | Wang |

FOREIGN PATENT DOCUMENTS

| | | |
|---|---|---|
| JP | H10255483 A | 9/1998 |
| JP | 2002134707 A | 5/2002 |
| JP | 2005174977 A | 6/2005 |
| JP | 2005277170 A | 10/2005 |
| JP | 2008085178 A | 4/2008 |
| JP | 2010192520 A | 9/2010 |
| JP | 2011155198 A | 8/2011 |
| JP | 2013042140 A | 2/2013 |
| JP | 2013187398 A | 9/2013 |

OTHER PUBLICATIONS

Office Action from related Japanese patent application No. 2016-564312, dated Oct. 10, 2017, 13 pp.
Preliminary Rejection from related Korean patent application No. 10-2016-7032754, dated Jun. 29, 2018, 7 pp.
First Office Action from related Chinese patent application No. 201580029731.1, dated Oct. 29, 2018, 18 pp.
International Search Report and Written Opinion from related international application No. PCT/US2015/026994, dated Jul. 29, 2015, 15 pp.
Office Action from related Taiwanese patent application No. 104113572, dated Aug. 11, 2016, 14 pp.
Ramaswamy, et al., "Metal Gate recessed Access Device (RAD) for DRAM Scaling", IEEE Workshop on Microelectronics and Electron Devices, Apr. 20, 2007, pp. 42-44. Boise, Idaho.
Shimojo, et al_ "High-Density and High-Speed 128Mb Chain FeRAM with SDRAM-Compatible DDR2 Interface", Symposium on VLSI Technology Digest of Technical Papers, 2009, pp. 218-219.

* cited by examiner

FERROELECTRIC MEMORY AND METHODS OF FORMING THE SAME

PRIORITY INFORMATION

This application is a Continuation of U.S. application Ser. No. 14/263,610 filed Apr. 28, 2014, the specification of which is incorporated herein by reference.

TECHNICAL FIELD

The present disclosure relates generally to semiconductor devices and methods, and more particularly to ferroelectric devices and methods of forming the same.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), ferroelectric random access memory (FeRAM), magnetic random access memory (MRAM), resistive random access memory (RRAM), and flash memory, among others. Some types of memory devices can be non-volatile memory and can be used for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

Similar to DRAM cells, FeRAM cells can comprise a capacitor (e.g., ferroelectric capacitor) in series with an access device (e.g., transistor). As such, FeRAM has benefits such as a relatively fast program/read time as compared to flash memory, for example. However, unlike DRAM, FeRAM is a non-volatile memory.

DETAILED DESCRIPTION

A ferroelectric memory array includes a buried recessed access device (BRAD) formed in a substrate and a ferroelectric storage device formed on the BRAD.

In a number of embodiments, a ferroelectric memory array can comprise a plurality of ferroelectric storage devices (e.g., ferroelectric capacitors) and corresponding access devices (e.g., transistors) coupled in a chained configuration (e.g., in series) between a first conductive line (e.g., a plate line) and a second conductive line (e.g., a bit line). The access devices can be buried recessed access devices (BRADs) whose gates are coupled to respective conductive lines (e.g., word lines) of the array.

Embodiments of the present disclosure can provide advantages over previous FeRAM cells and/or systems. For instance, a number of embodiments comprise a ferroelectric capacitor formed on, and on pitch with, a BRAD. A BRAD can have a reduced feature size as compared to other access devices such as planar transistors, for instance. Also, in a number of embodiments, the ferroelectric capacitors can be "container" capacitors (e.g., capacitors that can be formed in a vertical container structure), which can provide a smaller feature size as compared to prior art planar ferroelectric "parallel plate" capacitors, for example. As such, a number of embodiments described herein can provide increased cell density as compared to previous approaches. For instance, a number of embodiments can achieve a cell size of $4F^2$.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 108 may reference element "08" in FIG. 1, and a similar element may be referenced as 408 in FIG. 4. Also, as used herein, "a number of" a particular element and/or feature can refer to one or more of such elements and/or features.

Figure 1:
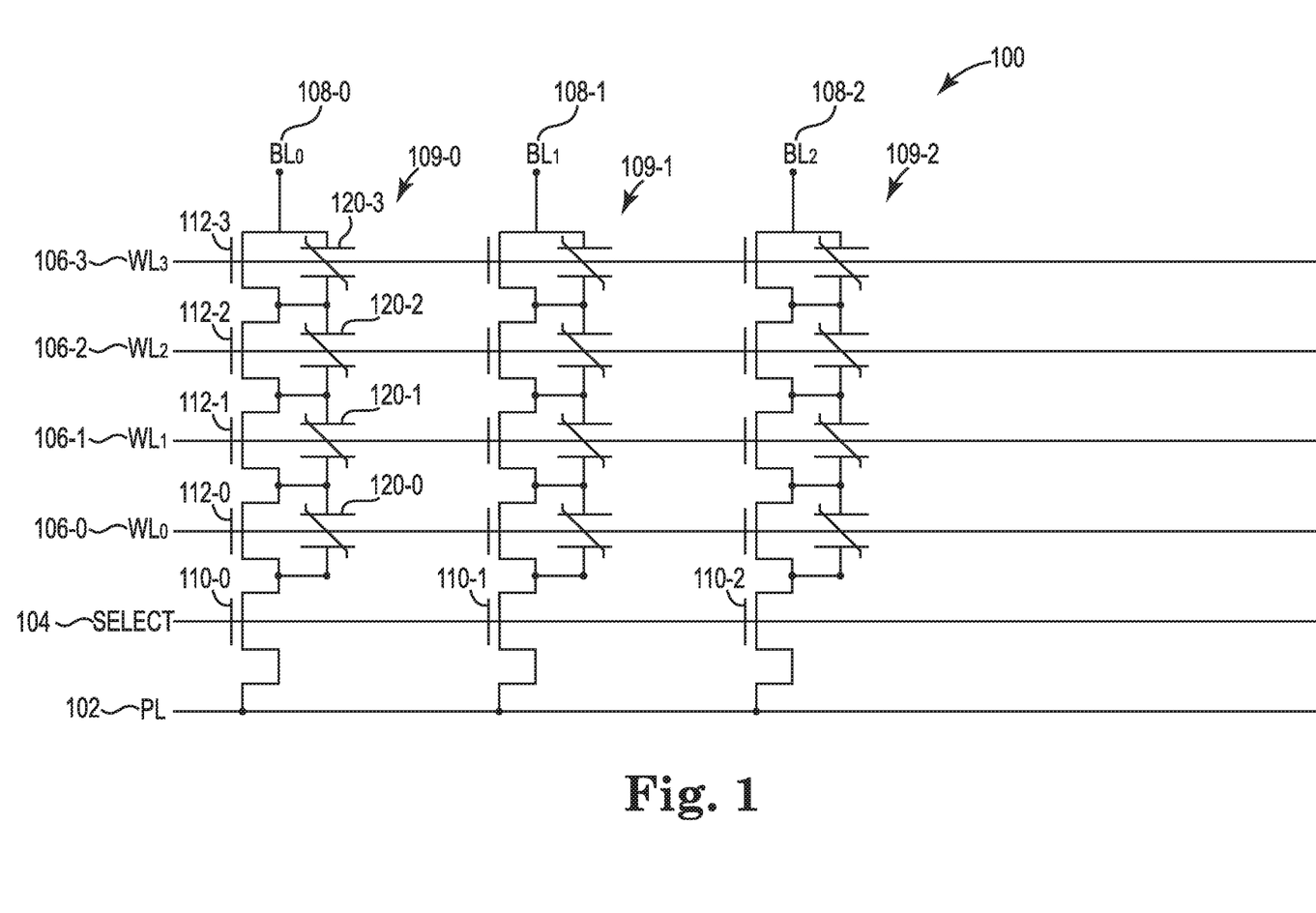
FIG. 1 illustrates a schematic of a portion of a memory array in accordance with a number of embodiments of the present disclosure.

FIG. 1 illustrates a schematic of a portion of a memory array 100 in accordance with a number of embodiments of the present disclosure. The array 100 comprises non-volatile ferroelectric memory cells in a chain configuration (e.g., connected in series); however, embodiments are not limited to this example. The memory array 100 includes conductive lines 106-0, 106-1, 106-2, and 106-4, which may be referred to herein as access lines or "word lines," and intersecting conductive lines 108-0, 108-1, and 108-2, which may be referred to as sense lines or "bit lines." For ease of addressing in the digital environment, the number of word lines 106-0 to 106-3 and the number of bit lines 108-0 to 108-2 can each be some power of two (e.g., 256 word lines by 4,096 bit lines). The word lines and/or bit lines can comprise conductive material(s) (e.g., metals, such as titanium nitride, tantalum nitride, platinum, copper, tungsten, tungsten nitride, and/or ruthenium, among other conductive materials and/or combinations thereof). Although three bit lines and four word lines are shown in FIG. 1, embodiments are not limited to a particular number of bit lines and/or word lines.

Memory array 100 includes strings 109-0, 109-1, 109-2 of cells each comprising a ferroelectric storage device (e.g., 120-0, 120-1, 120-2, 120-3) and a corresponding access device (e.g., 112-0, 112-1, 112-2, 112-3). The access devices 112-0, 112-1, 112-2, and 112-3 associated with each string 109-0, 109-1, and 109-2 are coupled to respective word lines 106-0, 106-1, 106-2, and 106-3. Each string 109-0, 109-1, and 109-2 is also associated with a respective bit line 108-0, 108-1, and 108-2. The memory cells of each string 109-0, 109-1, and 109-2 are connected in series. For instance, the access devices (e.g., transistors) 112-0, 112-1, 112-2, and 112-3 are coupled source to drain between a source select gate (e.g., a field-effect transistor (FET)) 110-0, 110-1, 110-2 and a bit line contact. The source select gates 110-0, 110-1, 110-2 are configured to selectively couple a respective string to a common plate line (PL) 102 responsive to a signal on source select line (SELECT) 104. Although not shown in FIG. 1, each string 109-0, 109-1, and 109-2 can include a drain select gate coupled at an end of the string opposite the source select gate 110-0, 110-1, 110-2 is configured to selectively couple a respective string 109-0, 109-1, and 109-2 to a respective bit line 108-0, 108-1, and 108-2 responsive to a signal applied to its gate via a drain select line (not shown). It is noted that elements such as word lines 106-0, 106-1, 106-2, and 106-3, bit lines 108-0, 108-1, and 108-2, and strings 109-0, 109-1, 109-2 may be referred to in a general manner as word lines 106, bit lines 108, and strings 109.

In a number of embodiments, and as shown in FIG. 1, the ferroelectric storage devices 120-0, 120-1, 120-2, 120-3 (e.g., ferroelectric capacitors) of respective strings 109-0, 109-1, and 109-2 are also connected in series. For instance, as described further below, an electrode of each ferroelectric capacitor in a string is connected to an electrode of an adjacent electrode in the string.

In a number of embodiments, the access devices 112 are buried recessed access devices (BRADs). As described further below, the access devices 112 comprise a source, a drain, and a buried gate (e.g., control gate). The ferroelectric storage devices 120 can be ferroelectric capacitors comprising a ferroelectric material between a pair of capacitor electrodes. As described further below, the ferroelectric capacitors can have a vertical container structure formed in vias having an aspect ratio of about 10:1 or greater; however, embodiments are not limited to a particular aspect ratio.

The ferroelectric capacitors 120 can be formed on the BRADs 112 such that they are on pitch. As such, embodiments of the present disclosure can provide benefits such as a smaller footprint and increased density as compared previous ferroelectric memories, which may employ planar access devices (e.g., planar transistors) and/or planar parallel plate capacitors.

Each word line 106 commonly couples the gates of a number of access devices 112 corresponding to a "row" of memory cells. Each string 109 corresponds to a "column" of memory cells coupled to a particular bit line 108. The use of the terms "column" and "row" is not meant to imply a particular linear (e.g., vertical and/or horizontal) orientation of the memory cells.

As one of ordinary skill in the art will appreciate, a number of cells coupled to a selected word line (e.g., 106-0, 106-1, 106-2, and 106-3) can be programmed and/or sensed (e.g., read) together as a page of memory cells. A programming (e.g., write) operation can include activating access devices coupled to unselected word lines (e.g., word lines coupled to cells not being programmed) while maintaining access devices coupled to a selected word line in an inactive (e.g. non-conductive) state. An applied voltage between the electrodes of the ferroelectric capacitor (e.g., via common plate line 102 and bit lines 108) can result in a polarized state of the ferroelectric material. The polarization can correspond to a data state of the selected cell (e.g., a logic "0" or "1").

A sense operation, such as a read operation, can include activating access devices coupled to unselected word lines (e.g., word lines coupled to cells not being programmed) while maintaining access devices 112 coupled to the selected word line 106 in an inactive (e.g. non-conductive) state. A sense amplifier (not shown) can be coupled to the bit line 108 and can be used to determine the stored data state of the selected cell based on a sensed current and/or voltage on the bit line 108 responsive to the polarization of the capacitor 120.

Figure 2A:
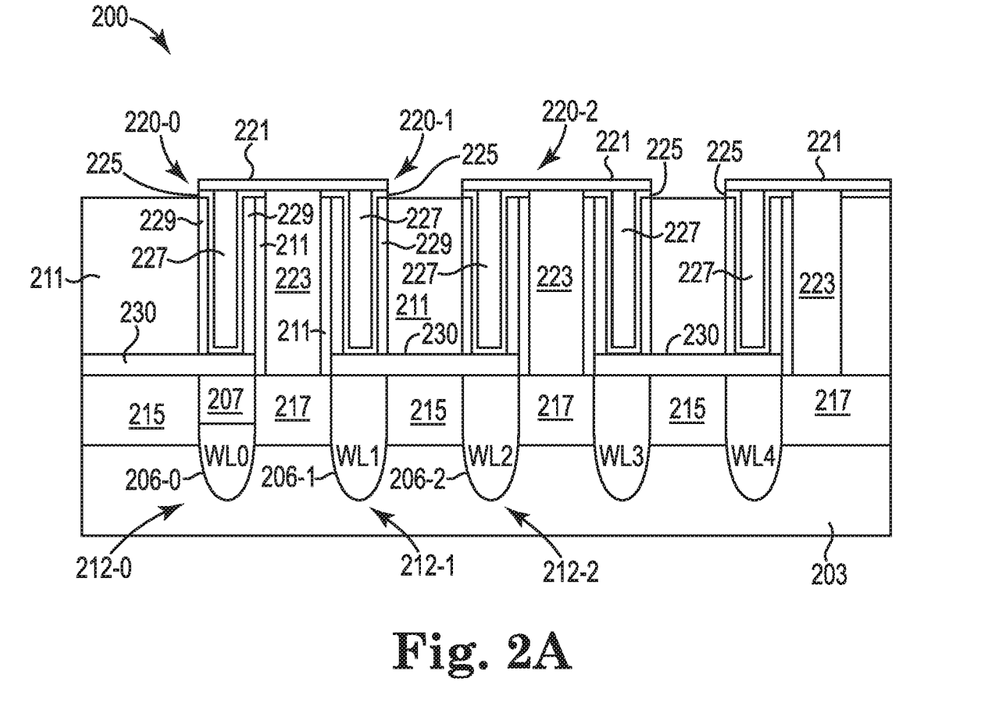
FIG. 2A illustrates a cross-sectional view of a portion of a ferroelectric memory array in accordance with a number of embodiments of the present disclosure.
Figure 2B:
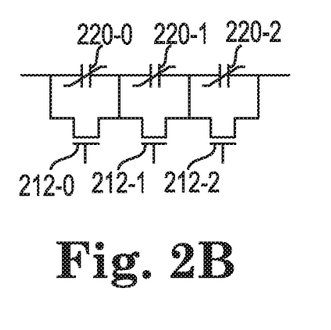
FIG. 2B illustrates a schematic of a portion of the array shown in FIG. 2A.

FIG. 2A illustrates a cross-sectional view of a portion of a ferroelectric memory array 200 in accordance with a number of embodiments of the present disclosure. FIG. 2B illustrates a schematic of a portion of the array 200 shown in FIG. 2A. The array 200 comprises a number of ferroelectric memory cells coupled in a chained configuration such as shown in FIG. 1. The memory cells each comprise a ferroelectric capacitor (e.g., 220-0, 220-1, 220-2) formed on a respective BRAD (e.g., 212-0, 212-1, 212-2).

The access devices (e.g., 212-0, 212-1, 212-2) comprise a gate coupled to a respective word line (e.g., 206-0 (WL0), 206-1 (WL1), 206-2 (WL2)), a pair of source/drain regions 215, 217 (e.g., active regions), and a capping material 207. Although not shown in FIG. 2A, a gate oxide material can be formed on sidewalls of a gate trench in which the gate and capping material are formed. The gate can comprise a conductive material such as a doped polysilicon material, titanium nitride (TiN), and/or tantalum nitride (TaN), among other conductive materials and/or combinations thereof. The gates of the access devices are located beneath a surface of (e.g., buried in) a substrate 203. The substrate 203 can be a semiconductor substrate, a silicon on insulator (SOI) substrate, and/or a silicon on sapphire (SOI) substrate, among other substrate structures, which may include various doped and/or undoped semiconductor materials, for example. The source/drain regions 215, 217 can be doped regions extending into substrate 203. The source/drain regions 215, 217 can be doped with various chemical species such as species including phosphorus, arsenic, and/or boron ions, via ion implantation or other suitable doping processes. The doping concentration of source/drain region 215 may or may not be the same as the doping concentration of source/drain region 217. The capping material of the access devices 212 can be a dielectric material such as silicon nitride (SiN), among other suitable dielectric materials.

The ferroelectric capacitors (e.g., 220-0, 220-1, 220-2) of array 200 comprise a ferroelectric material 225 between a pair of capacitor electrodes 229 and 227. The electrode 229 may be referred to as a bottom electrode and the electrode 227 may be referred to as a top electrode. The electrode 227 and/or the electrode 229 can comprise conductive materials such as doped polysilicon and/or metal materials, among various other suitable electrode materials. The ferroelectric material 225 can comprise various materials such as lead zirconate titanate (PZT), strontium bismuth tantalate (SBT), hafnium oxide based materials, perovskite materials (e.g., calcium titanium oxide), and/or bismuth lanthanum titanate, among other ferroelectric materials and/or combination thereof. In some embodiments the ferroelectric material 225 can comprise a hafnium oxide based material and/or a zirconium oxide based material. In specific embodiments, the hafnium oxide based material and/or the zirconium oxide based material are doped with at least one of: silicon (Si), aluminum (Al), germanium (Ge), magnesium (Mg), calcium (Ca), strontium (Sr), niobium (Nb), yttrium (Y), barium (Ba), titanium (Ti), and/or a combination thereof.

The capacitor electrode 229 is coupled to a source/drain region 215 of an access device 212 via a conductive contact 230. The capacitor electrode 227 is coupled to a source/drain region 217 of the access device 212 via a conductive contact 221 and a conductive contact pillar 223.

The ferroelectric capacitors 220 can be formed in a manner similar to DRAM "container" capacitors with the exception of the dielectric material of a DRAM capacitor being replaced with ferroelectric material 225. As an example, a number of conductive contacts 230 can be formed on the BRADs 212 in contact with source/drain regions 215, 217 as shown in FIG. 2A. A dielectric material 211 can be formed on the substrate, and a number of containers (e.g., vias) can be formed (e.g., etched) in the dielectric material 211 over conductive contacts 230. An electrode material can be formed in the containers (e.g., on the sidewalls and bottom of the container) and a planarization process can be performed to form the bottom electrode 229 confined within the container as shown. A ferroelectric material can then be formed (e.g., conformally) in the container (e.g., on the sidewalls and bottom of the bottom electrode 229), and an electrode material can be formed in the container (e.g., on the sidewalls and bottom of the ferroelectric 225) to serve as top electrode 227. A planarization process may be performed to confine the top electrode 227 within the container. A number of vias can be etched in dielectric material 211, and the vias can be filled with a conductive material to serve as the top electrode contact pillars 223. A conductive contact material can then be patterned and etched to form the conductive contacts 221 thereby coupling the top electrodes 227 to the respective conductive contact pillars 223.

In a number of embodiments, the ferroelectric material 225 can be formed (e.g., deposited) via atomic layer deposition (ALD), which can be beneficial due to the dimensions of the containers, which can have a length and/or width dimension or diameter of about 300 angstroms and a height of about 10 kiloangstroms or more, for example. In some embodiments, the dimension of the container includes a range of the diameter from 5 nanometers (nm) to 150 nanometers (nm) with a range of the length from 100 nanometers to 25 kiloangstroms. In instances in which the aspect ratio of the containers is 10:1 or greater, it can be difficult to suitably form the ferroelectric within the container using other deposition processes such as physical vapor deposition (PVD), for example.

As shown in FIG. 2A, the capacitors 220 are formed on pitch with the corresponding BRADs 212. Since the BRADs 212 have a smaller physical footprint as compared to planar transistors, for instance, the density of the array 200 can be improved as compared to previous ferroelectric memory arrays. As an example, the memory cells illustrated in FIG. 2 can achieve a $4F^2$ cell size.

Figure 3:
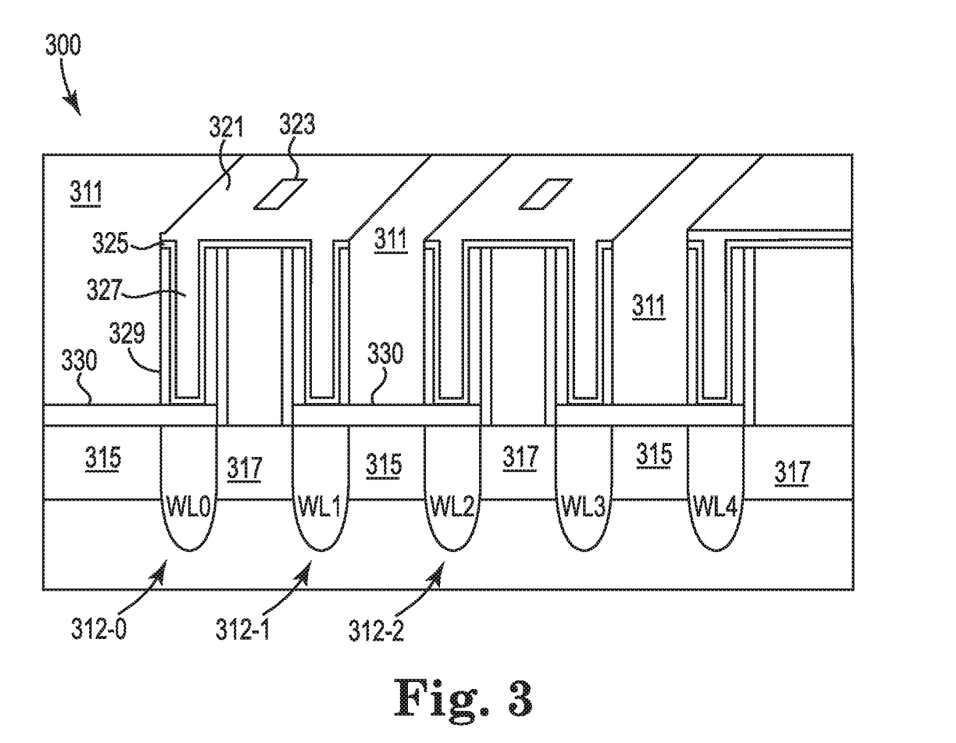
FIG. 3 illustrates a cross-sectional view of a portion of a ferroelectric memory array in accordance with a number of embodiments of the present disclosure.

FIG. 3 illustrates a cross-sectional view of a portion of a ferroelectric memory array 300 in accordance with a number of embodiments of the present disclosure. The array 300 comprises a number of ferroelectric memory cells coupled in a chained configuration such as shown in FIG. 1, FIG. 2A, and FIG. 2B. The memory cells each comprise a ferroelectric capacitor (e.g., 320-0, 320-1, 320-2) formed on a respective BRAD (e.g., 312-0, 312-1, 312-2).

The ferroelectric capacitors (e.g., 320-0, 320-1, 320-2) of array 300 comprise a ferroelectric material 325 between a pair of capacitor electrodes 329 and 327. The electrode 329 may be referred to as a bottom electrode and the electrode 327 may be referred to as a top electrode. The capacitor electrode 329 is coupled to a source/drain region 315 of an access device 312 via a conductive contact 330. The capacitor electrode 327 is coupled to a source/drain region 317 of the access device 312 via a conductive contact 321 and a conductive contact pillar 323.

The ferroelectric capacitors 320-0, 320-1, 320-2 are coupled in series and aligned (e.g., along corresponding strings. In some embodiments, the conductive contact pillar 323 is not located entirely between in the ferroelectric capacitors 320-0, 320-1, 320-2. That is, the conductive contact pillar 323 can be positioned at a location that is not entirely between adjacent ferroelectric capacitors 320-0, 320-1, 320-2 of a given string. For example, in some embodiments, the contact pillar 323 is positioned at least partially on a dielectric material of an isolation region separating ferroelectric capacitors of a first string from ferroelectric capacitors of an adjacent string. As such, the conductive contact pillars 323 may be considered as being located "behind" the respective capacitors to which they correspond because the pillars 323 are between adjacent strings of capacitors 320.

In a number of embodiments, ferroelectric capacitors 320-0, 320-1, 320-2 having a relatively high aspect ratio, as compared to planar capacitors, are able to be formed on pitch with a number of corresponding BRADs 312 to achieve a smaller footprint and increased density as compared to previous ferroelectric memory. In some embodiments, a ferroelectric chain architecture is achieved that is $4F^2$. In some embodiments, a conductive contact pillar 323 can be positioned at a location that is "behind" a corresponding string of ferroelectric storage devices 320-0, 320-1 to enable ferroelectric storage devices 320-0, 320-1 of a string to be positioned closer to each other as compared to embodiments in in which the conductive contact pillar 323 is formed in alignment (e.g., between) ferroelectric storage devices 320-0, 320-1 of a string, which may achieve a smaller footprint and increased density as compared to previous ferroelectric memory.

Figure 4:
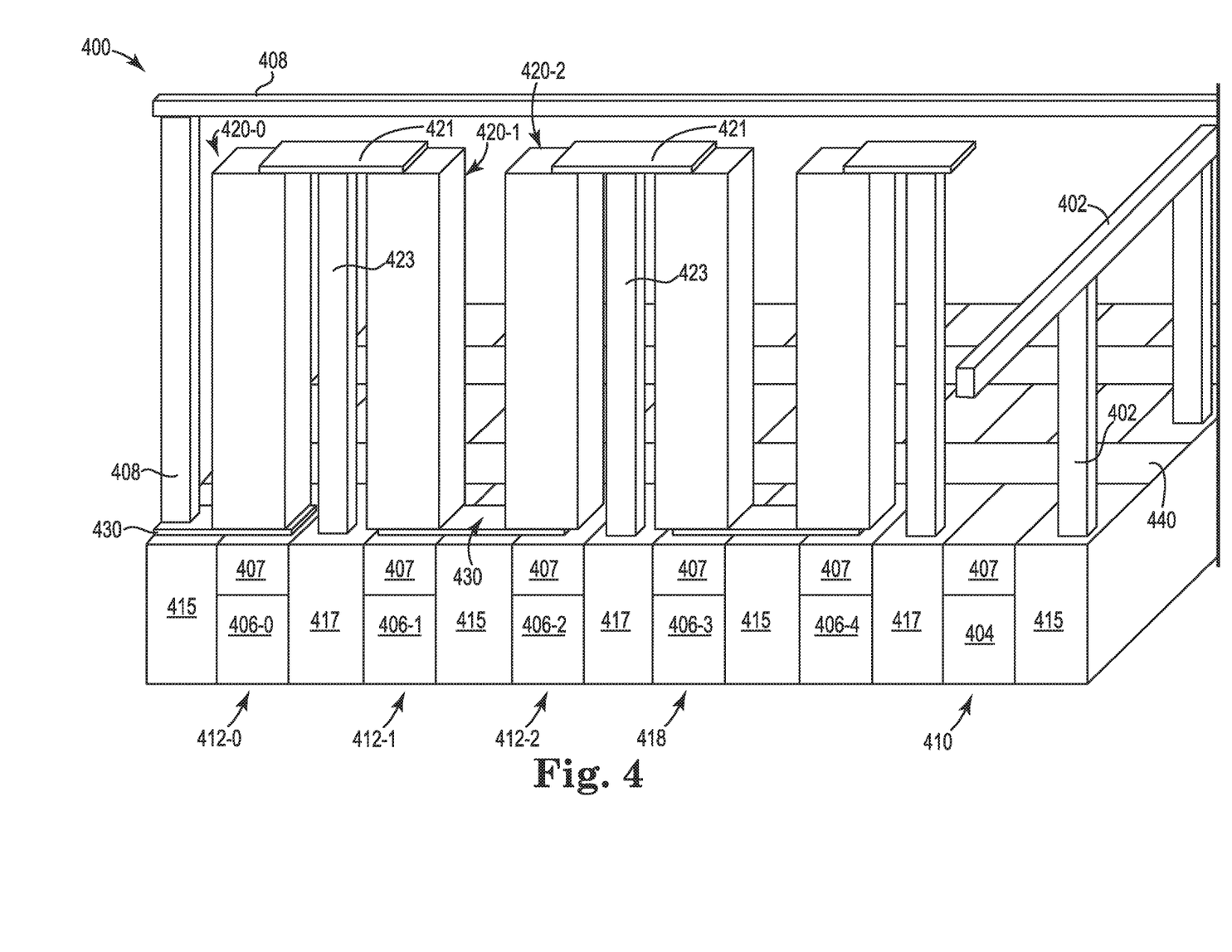
FIG. 4 illustrates a three-dimensional view of a portion of a ferroelectric memory array in accordance with a number of embodiments of the present disclosure.

FIG. 4 illustrates a three-dimensional view of a portion of a memory array 400 in accordance with a number of embodiments of the present disclosure.

The memory array 400 includes a plate line 402 coupled to ferroelectric storage device 420 via a select transistor 410 coupled to a select line 404, a number of ferroelectric capacitors 420, a number of electrodes 421, 430, contact pillars 423, access devices 412, word lines 406, a bit line 408, and/or an isolation region 440. The array 400 comprises a number of ferroelectric memory cells coupled in a chained configuration such as shown in FIG. 1, FIG. 2A, FIG. 2B, and FIG. 3. The memory cells each comprise a ferroelectric capacitor (e.g., 420-0, 420-1, 420-2) formed on a respective BRAD (e.g., 412-0, 412-1, 412-2).

The access devices (e.g., 412-0, 412-1, 412-2) comprise a gate coupled to a respective word line (e.g., 406-0, 406-1, 406-2), a pair of source/drain regions 415, 417 (e.g., active regions), and a capping material 407. A gate oxide material can be formed on sidewalls of a gate trench in which the gate and capping material are formed. The gates of the access devices are located beneath a surface of (e.g., buried in) a substrate (Not Shown). The source/drain regions 415, 417 can be doped regions extending into substrate.

As described herein, the ferroelectric capacitors 420 of array 400 comprise a ferroelectric material between a pair of capacitor electrodes. The pair of capacitor electrodes can be referred to as a top capacitor electrode and a bottom capacitor electrode. The bottom capacitor electrode of the ferroelectric capacitors 420 is coupled to a source/drain region 415 of an access device 412 via a conductive contact 430. The top capacitor electrode is coupled to a source/drain region 417 of the access device 412 via a conductive contact 421 and a conductive contact pillar 423.

In a number of embodiments, the ferroelectric material can be formed (e.g., deposited) via atomic layer deposition (ALD), which can be beneficial due to the dimensions of the containers, which can have a length and/or width dimension or diameter of about 300 angstroms and a height of about 10 kiloangstroms or more, for example. In instances in which the aspect ratio of the containers is 10:1 or greater, it can be difficult to suitably form the ferroelectric within the container using other deposition processes such as physical vapor deposition (PVD), for example.

Additional rows of ferroelectric capacitors 420 are separated using an isolation region 440. The isolation region 440 is utilized to separate a first row of ferroelectric capacitors 420 from an adjacent and/or parallel second row of ferroelectric capacitors 420. In some embodiments, the isolation region 440 comprises a dielectric material deposited in a trench that runs parallel to the ferroelectric storage capacitors 420. As described further herein, in certain embodiments, the contact pillar 423 is at least partially on the dielectric material that corresponds to the isolation region 440.

Figure 5:
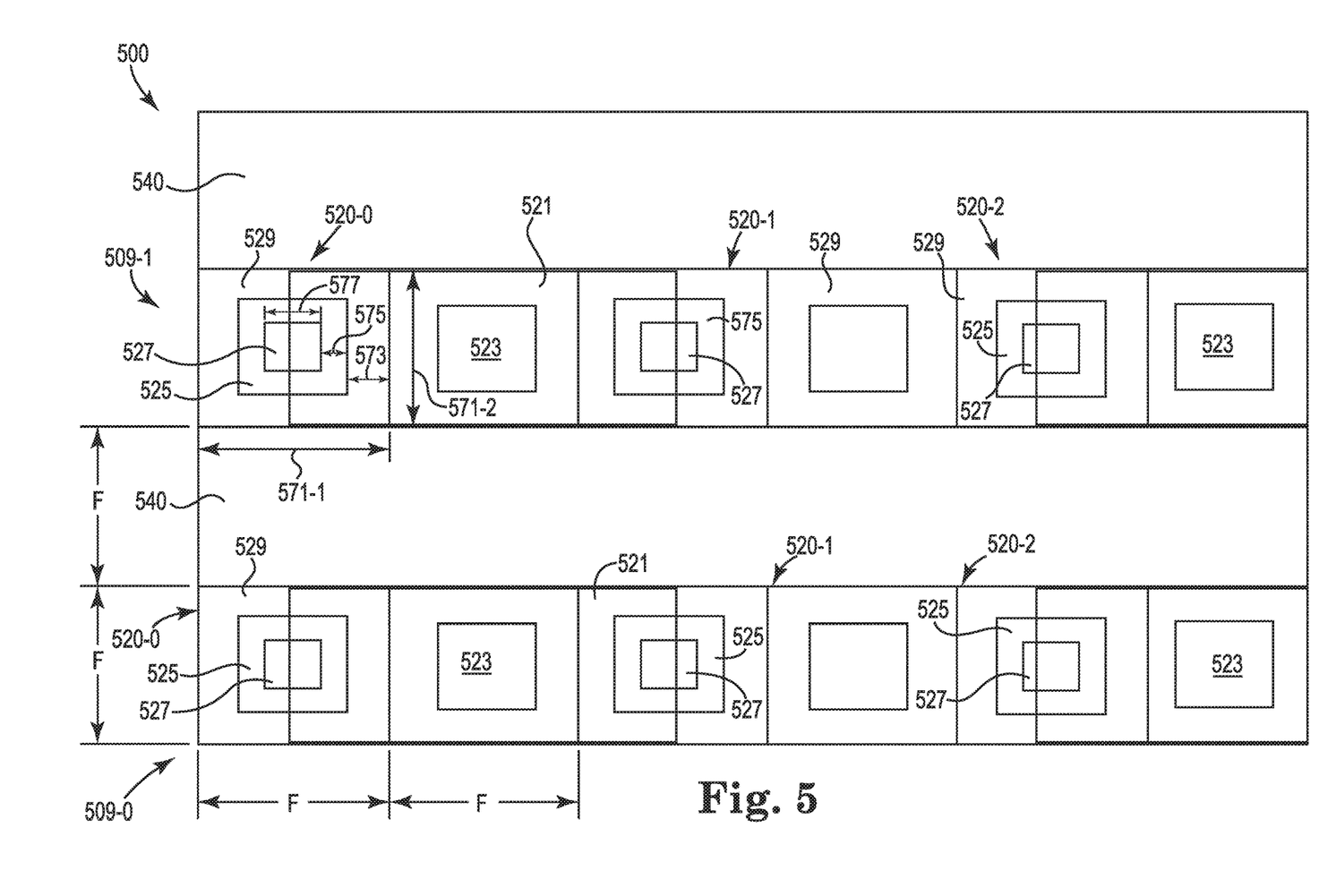
FIG. 5 illustrates an overhead view of a portion of a ferroelectric memory array in accordance with a number of embodiments of the present disclosure.

FIG. 5 illustrates an overhead view of a portion of a memory array 500 in accordance with a number of embodiments of the present disclosure. The portion shown in FIG. 5 includes two strings 509-0 and 509-1 of memory cells. Region 540 represents an isolation region (e.g., STI trench) between the access devices (e.g., BRADs) of adjacent strings 509-0 and 509-1.

As described herein, the ferroelectric capacitors (e.g., 520-0, 520-1, 520-2) of strings 509-0 and 509-1 are coupled in series (e.g., in a chain architecture). That is, ferroelectric capacitor 520-0 is coupled to ferroelectric capacitor 520-1 via a conductive contact 521 (e.g., top conductive contact) connected to a contact pillar 523. In addition, ferroelectric capacitor 520-1 is coupled to ferroelectric capacitor 520-2 via a conductive contact (e.g., bottom conductive contact) (not shown). The first string 509-0 of ferroelectric capacitors 520 and the second string 509-1 of ferroelectric capacitors 520 are separated by an isolation region 540 comprising a trench with at least a portion of the isolation region 540 comprising a dielectric material.

In some embodiments, the contact pillar 523 is positioned between the ferroelectric capacitor 520-0 and the ferroelectric capacitor 520-1. In certain embodiments, the contact pillar 523 is positioned at a location that equidistant between the ferroelectric capacitor 520-0 and the ferroelectric capacitor 520-1. That is, in certain embodiments, the distance between the contact pillar 523 and the ferroelectric capacitor 520-0 is equal to the distance between the contact pillar 523 and the ferroelectric capacitor 520-1. In certain embodiments, the contact pillar 523 is positioned at a location that is equidistant from a front side and a back side of the ferroelectric capacitor 520-0, 520-1. That is, the contact pillar 523 is positioned at a relatively center location between the ferroelectric capacitor 520-0 and the ferroelectric capacitor 520-1.

In some embodiments, the contact pillar 523 is positioned at a location that is "behind" the ferroelectric capacitors 520. For example, the contact pillar 523 is located "behind" the ferroelectric capacitors 520 in string 509-0 when the contact pillar 523 is not located at a position of a relatively center location between the ferroelectric capacitors 520. In some embodiments, the contact pillar 523 is formed such that at least a portion of the contact pillar 523 is on a portion of the isolation region 540. For example, in some embodiments, the contact pillar 523 is positioned at least partially on a dielectric material of an isolation region 540 separating ferroelectric capacitors 520 of a first string 509-0 from ferroelectric capacitors of an adjacent string 509-1. As such, the conductive contact pillars 523 may be considered as being located "behind" the respective capacitors 520 to which they correspond because the pillars 523 are between adjacent strings 509 of capacitors 520.

The ferroelectric capacitors 520 of array 500 comprise a ferroelectric material 525 between a pair of capacitor electrodes 529 and 527. The electrode 529 may be referred to as a bottom electrode and the electrode 527 may be referred to as a top electrode.

The capacitor electrode 529 is coupled to a source/drain region of an access device via a conductive contact. The capacitor electrode 527 is coupled to a source/drain region of the access device via a conductive contact 521 and a conductive contact pillar 523.

In a number of embodiments, the ferroelectric material 525 can be formed (e.g., deposited) via atomic layer deposition (ALD), which can be beneficial due to the dimensions of the containers, which can have a length and/or width dimension or diameter 571-1, 571-2 of about 300 angstroms and a height of about 10 kiloangstroms or more, for example. The diameter 571-1, 571-2 can be a feature size (F). In addition, the ferroelectric material 525 can have a length 577 of about 100 angstroms, a length 575 of about 50 angstroms, and a length 573 of about 50 angstroms. In instances in which the aspect ratio of the containers is 10:1 or greater, it can be difficult to suitably form the ferroelectric within the container using other deposition processes such as physical vapor deposition (PVD), for example.

Positioning a contact pillar 523 "behind" the ferroelectric capacitor string 509-0, 509-1 saves space within the ferroelectric memory array 500. For example, positioning the contact pillar 523 on a dielectric portion associated with the isolation region 540 can enable the ferroelectric capacitor 520-0 to be positioned at a location that is relatively closer to ferroelectric capacitor 520-1 compared to an embodiment where the contact pillar 523 is positioned between the ferroelectric capacitors 520-0, 520-1.

Figure 6:
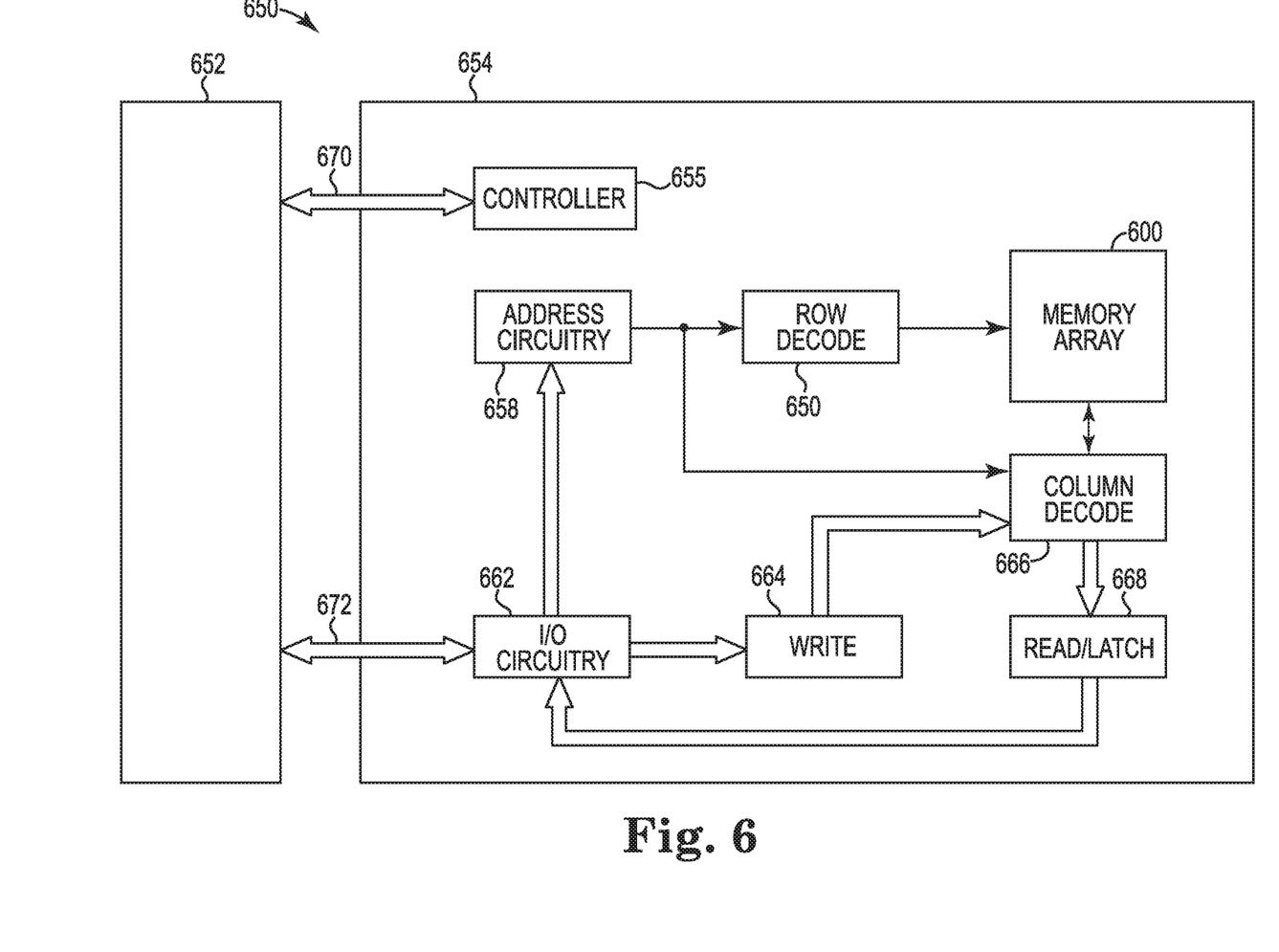
FIG. 6 illustrates a block diagram of an apparatus in the form of a memory system having a ferroelectric memory device operated in accordance with a number of embodiments of the present disclosure.

FIG. 6 illustrates a block diagram of an apparatus in the form of a memory system 650 having a ferroelectric memory array 600 in accordance with a number of embodiments of the present disclosure. Memory system 650 includes a memory access device 652 (e.g., a host processor, firmware, etc.) coupled to a memory device 654, which includes an array 600 of non-volatile ferroelectric memory cells such as those described herein below. In a number of embodiments, the memory device 654, memory array 600, and/or controller 655 may also be considered an "apparatus."

The memory device 654 and memory access device 652 can be implemented as separate integrated circuits, or the access device 652 and the memory device 654 can be incorporated into the same integrated circuit, chip, or package. The memory access device 652 can be a discrete device (e.g., microprocessor) or some other type of process circuitry implemented in firmware, such as an application-specific integrated circuit (ASIC).

I/O connections 672 and control connections 670 comprise a communication interface between the memory access device 652 and the memory device 654. The embodiment of FIG. 6 includes address circuitry 658 to latch address signals provided over the I/O connections 672 through I/O circuitry 662. Address signals are received and decoded by a row decoder 650 and a column decoder 666 to access the memory array 600.

The memory device 654 senses data in the memory array 600 by sensing voltage and/or current changes in the memory array columns using read/latch circuitry 668. The read/latch circuitry 668 can read and latch a page (e.g., a row) of data from the memory array 600. I/O circuitry 662 is included for bi-directional data communication over the I/O connections 672 with the memory access device 652. Write circuitry 664 is included to write data to the memory array 600.

A controller 655, which may be implemented as control logic circuitry, software, and/or firmware decodes signals communicated by control connections 670 from the memory access device 652. The controller 655 can control the operations on the memory device 654, and of the memory array 600, including data sensing (e.g., reading) and data programming (e.g., writing), for example.

Figure 7:
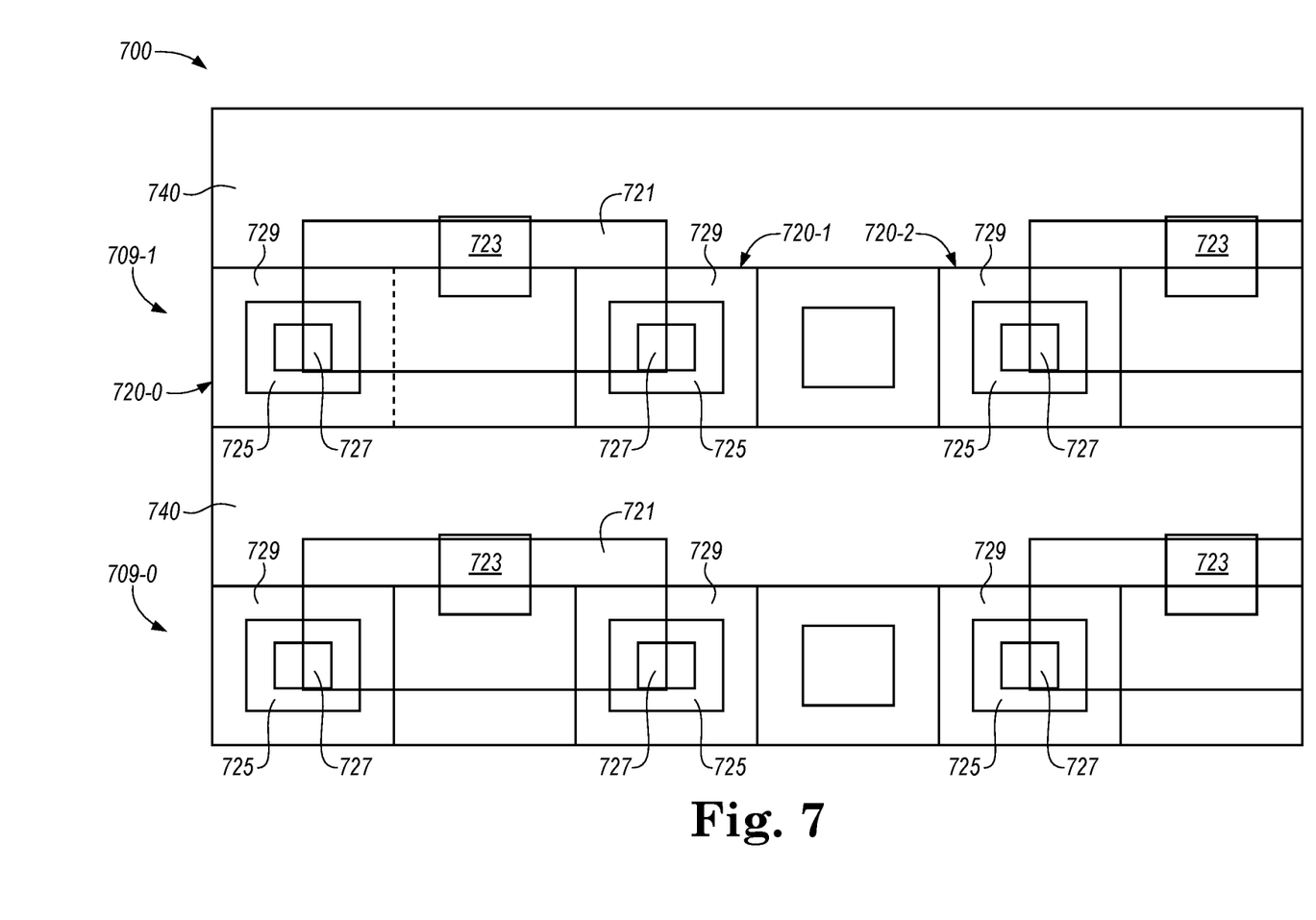
FIG. 7 illustrates an overhead view of a portion of a ferroelectric memory array in accordance with a number of embodiments of the present disclosure.

FIG. 7 illustrates an overhead view of a portion of a ferroelectric memory array 700 in accordance with a number of embodiments of the present disclosure. The array 700 is similar to the array 500 shown in FIG. 5. However, the embodiment shown in FIG. 7 illustrates contact pillar 723 positioned at locations "behind" the ferroelectric capacitors 720. Accordingly, in this embodiment, the contact pillars 723 are formed such that at least a portion of the contact pillars 723 are on a portion of the isolation region 740 between strings 709-0 and 709-1 of memory cells. Similar to the capacitors shown in FIG. 5, the capacitors 720 (e.g., 720-0, 720-1, and 720-2) comprise a ferroelectric material 725 between capacitor electrodes 727 and 729. The electrodes 727 are coupled to a contact pillar 723 via conductive contact 721.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
   a buried recessed access device (BRAD) formed in a substrate, wherein a gate of the BRAD is formed between a first source/drain region and a second source/drain region corresponding to the BRAD, and wherein the gate is formed below an upper surface of at least one of the first and the second source/drain region;
   a ferroelectric capacitor formed on the BRAD, wherein a bottom electrode of the ferroelectric capacitor is coupled to the first source/drain region, and wherein a top electrode of the ferroelectric capacitor is coupled to the second source/drain region; and
   a conductive contact coupled to the top electrode and to the second source/drain region, wherein the conductive contact is not positioned in alignment with the ferroelectric capacitor and an adjacent ferroelectric capacitor of an adjacent memory cell of a same row of memory cells and wherein the conductive contact is formed at least partially on the second source/drain region and at least partially on a dielectric material formed in a substrate corresponding to an isolation region between the same row of memory cells and an adjacent row.

2. The memory cell of claim 1, wherein the memory cell achieves a $4F^2$ architecture with F being a feature size corresponding to the memory cell.

3. The memory cell of claim 1, wherein the ferroelectric capacitor is a container capacitor having a ferroelectric material formed therein.

4. The memory cell of claim 3, wherein the ferroelectric material is formed on sidewalls of an electrode material in a container of the container capacitor.

5. The memory cell of claim 1, wherein the ferroelectric capacitor is on pitch with the BRAD.

6. A ferroelectric random access memory (FeRAM), comprising:
   a first plurality of ferroelectric capacitors coupled in series between a first conductive line and a second conductive line; and
   a second plurality of ferroelectric capacitors coupled in series between the first conductive line and a third conductive line;
   wherein each of the first and second plurality of ferroelectric capacitors are coupled to a respective buried recessed access device (BRAD) having a gate electrode formed beneath the corresponding ferroelectric capacitor;
   wherein each of the first plurality of ferroelectric capacitors are formed in a container and include:
      a bottom electrode formed on sidewalls of the container and on a bottom electrode contact;

a ferroelectric material formed in the container and on sidewalls of the bottom electrode;

a top electrode formed in the container and on sidewalls of the ferroelectric material, the top electrode coupled to a source/drain region of the corresponding BRAD via a conductive pillar, wherein a distance from the conductive pillar to a first side of a ferroelectric capacitor of the first plurality is different than a distance from the conductive pillar to a second side of the ferroelectric capacitor of the first plurality; and wherein the conductive pillar is not positioned in alignment with the first plurality and second plurality of ferroelectric capacitors of a same row of ferroelectric capacitors and wherein at least a portion of the conductive pillar is formed at least partially on an isolation region formed in a substrate separating BRADs corresponding to the first plurality of ferroelectric capacitors and BRADs corresponding to the second plurality of ferroelectric capacitors.

7. The FeRAM of claim 6, wherein the first side faces the second plurality of ferroelectric capacitors and the second side opposes the second plurality of ferroelectric capacitors.

8. The FeRAM of claim 6, wherein the conductive pillar is located between the first plurality of ferroelectric capacitors and the second plurality of ferroelectric capacitors.

9. The FeRAM of claim 6, wherein the first conductive line is a plate line, the second conductive line is a bit line, and the third conductive line is a different bit line.

10. The FeRAM of claim 6, wherein at least one of the first plurality of ferroelectric capacitors comprises a ferroelectric storage material selected from the group including:

lead zirconate titanate (PZT); and strontium bismuth tantalate (SBT);

a hafnium oxide based material; and a zirconium oxide based material.

11. The FeRAM of claim 10, wherein the hafnium oxide based material and the zirconium oxide based material are doped with at least one of: silicon (Si), aluminum (Al), germanium (Ge), magnesium (Mg), calcium (Ca), strontium (Sr), niobium (Nb), yttrium (Y), barium (Ba), titanium (Ti), and/or a combination thereof.

12. The FeRAM of claim 6, further comprising:

a first select device configured to selectively couple the first plurality of ferroelectric capacitors to the first conductive line; and a second select device configured to selectively couple the second plurality of ferroelectric capacitors to the first conductive line.

* * * * *